United States Patent
Lenox et al.

(10) Patent No.: US 9,362,375 B2
(45) Date of Patent: Jun. 7, 2016

(54) INNER L-SPACER FOR REPLACEMENT GATE FLOW

(71) Applicant: Texas Instruments Incorporated, Dallas, TX (US)

(72) Inventors: Chet Vernon Lenox, Venus, TX (US); Seung-Chul Song, Plano, TX (US); Brian K. Kirkpatrick, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/740,431

(22) Filed: Jun. 16, 2015

(65) Prior Publication Data

US 2015/0311304 A1    Oct. 29, 2015

Related U.S. Application Data

(62) Division of application No. 14/022,317, filed on Sep. 10, 2013, now Pat. No. 9,087,917.

(51) Int. Cl.

| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/423* | (2006.01) |
| *H01L 21/8234* | (2006.01) |
| *H01L 27/092* | (2006.01) |
| *H01L 21/02* | (2006.01) |
| *H01L 21/8238* | (2006.01) |
| *H01L 29/40* | (2006.01) |
| *H01L 29/66* | (2006.01) |

(52) U.S. Cl.
CPC ...... *H01L 29/42364* (2013.01); *H01L 21/0217* (2013.01); *H01L 21/02164* (2013.01); *H01L 21/823468* (2013.01); *H01L 21/823828* (2013.01); *H01L 21/823857* (2013.01); *H01L 21/823864* (2013.01); *H01L 27/092* (2013.01); *H01L 27/0928* (2013.01); *H01L 29/401* (2013.01); *H01L 29/42376* (2013.01); *H01L 29/66545* (2013.01); *H01L 29/66553* (2013.01)

(58) Field of Classification Search
CPC .............. H01L 29/6656; H01L 27/092; H01L 29/42376; H01L 27/0928; H01L 29/401; H01L 29/42364; H01L 29/66545; H01L 29/66553
USPC .................................. 257/369, 900
See application file for complete search history.

(56) References Cited

U.S. PATENT DOCUMENTS

| | | | | |
|---|---|---|---|---|
| 2001/0031521 A1* | 10/2001 | Pan | ...... | H01L 21/8249 438/197 |
| 2003/0094662 A1* | 5/2003 | Bae | ...... | H01L 21/28114 257/408 |
| 2012/0319214 A1 | 12/2012 | Ma et al. | | |

*Primary Examiner* — Thien F Tran
(74) *Attorney, Agent, or Firm* — Daniel Chan; Frank D. Cimino

(57) ABSTRACT

An integrated circuit is formed by removing a sacrificial gate dielectric layer and a sacrificial gate to form a gate cavity. A conformal dielectric first liner is formed in the gate cavity and a conformal second liner is formed on the first liner. A first etch removes the second liner from the bottom of the gate cavity, leaving material of the second liner on sidewalls of the gate cavity. A second etch removes the first liner from the bottom of the gate cavity exposed by the second liner, leaving material of the first liner on the bottom of the gate cavity under the second liner on the sidewalls of the gate cavity. A third etch removes the second liner from the gate cavity, leaving an L-shaped spacers of the first liner in the gate cavity. A permanent gate dielectric layer and replacement gate are formed in the gate cavity.

6 Claims, 10 Drawing Sheets

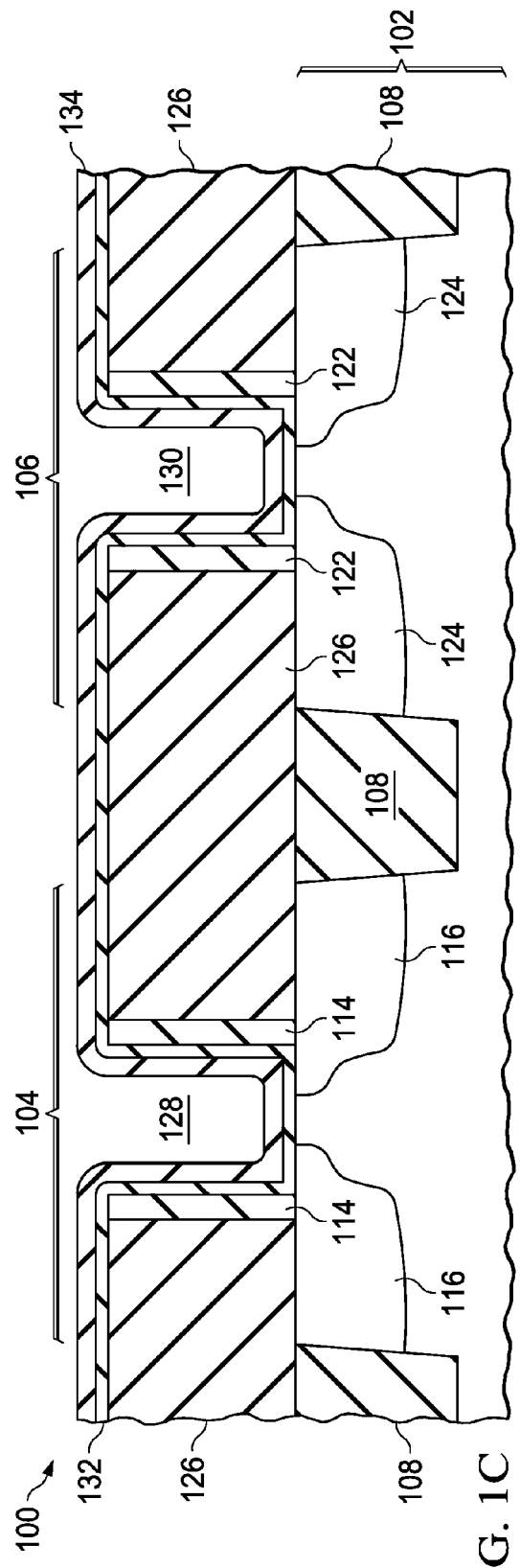
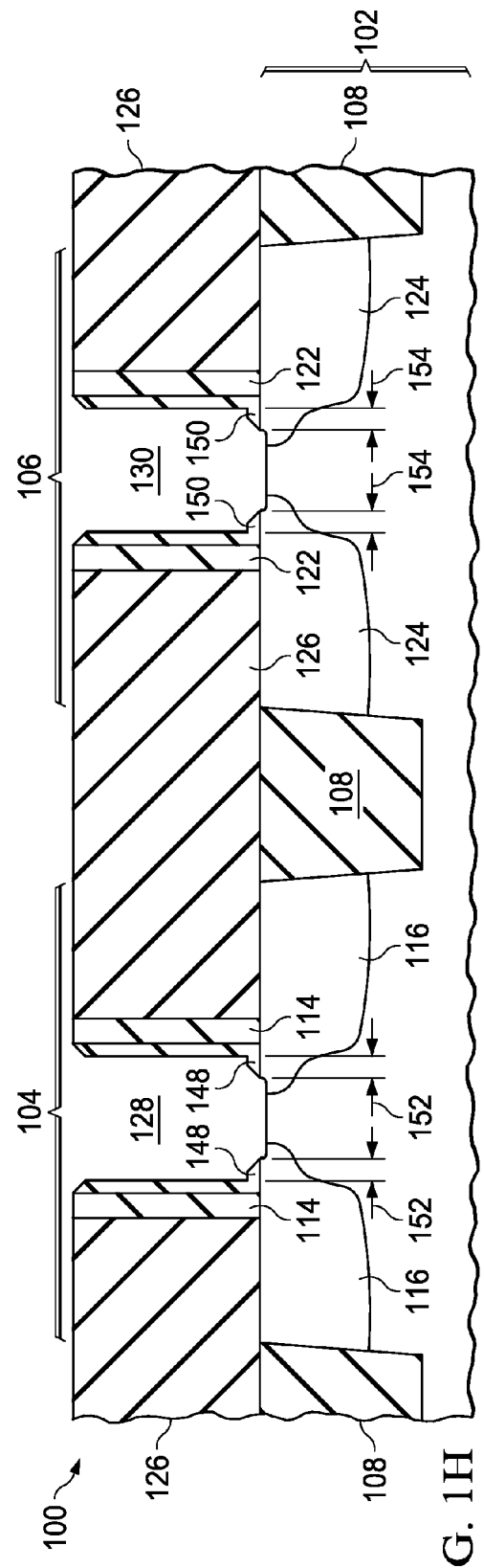
FIG. 1C
FIG. 1H

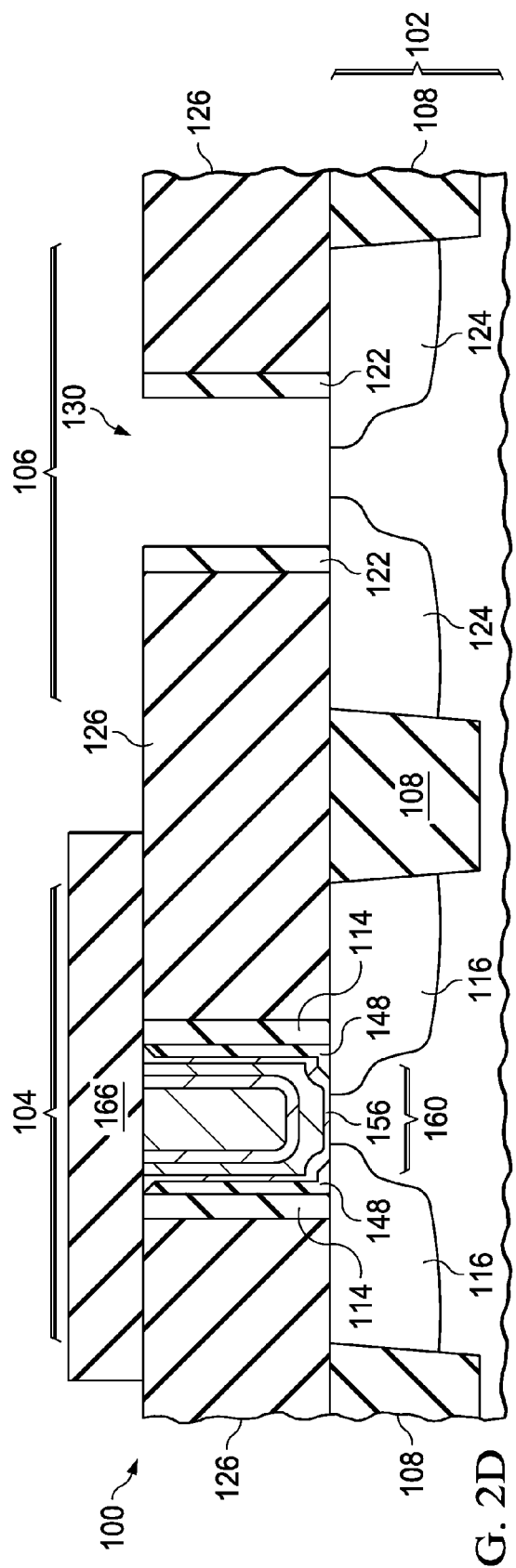
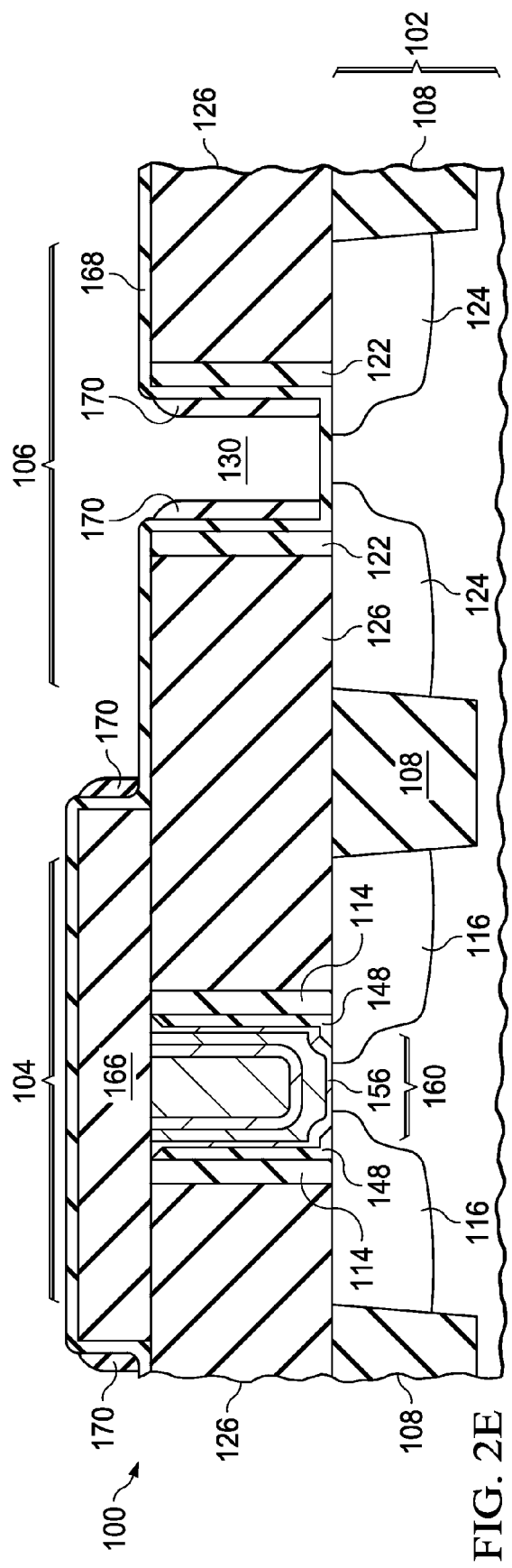
FIG. 2D
FIG. 2E

INNER L-SPACER FOR REPLACEMENT GATE FLOW

CROSS REFERENCE TO RELATED APPLICATIONS

This application is a divisional of U.S. Nonprovisional patent application Ser. No. 14/022,317, filed Sep. 10, 2013, the contents of which are herein incorporated by reference in its entirety.

FIELD OF THE INVENTION

This invention relates to the field of integrated circuits. More particularly, this invention relates to MOS transistors in integrated circuits.

BACKGROUND OF THE INVENTION

Replacement gate processes for metal oxide semiconductor (MOS) transistors must contend with increasingly smaller gate lengths and hence higher aspect ratios of the gate cavities to be filled. Replacement gate structures with several conformal layers may be especially challenging.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an MOS transistor is formed by forming a sacrificial gate dielectric layer and a sacrificial gate surrounded by dielectric material. A top surface of the sacrificial gate is exposed and the sacrificial gate and the sacrificial gate dielectric layer are removed to form a gate cavity. A conformal dielectric first liner is formed in the gate cavity and a conformal second liner is formed in the gate cavity on the first liner. An anisotropic first etch removes the second liner from the bottom of the gate cavity, leaving material of the second liner on sidewalls of the gate cavity. A second etch removes the first liner from an area of the bottom of the gate cavity exposed by the second liner, leaving material of the first liner on the bottom of the gate cavity under the second liner on the sidewalls of the gate cavity. A third etch removes the second liner from the gate cavity, leaving L-shaped spacers of the first liner in the gate cavity. A permanent gate dielectric layer is formed in the gate cavity and replacement gate is formed in the gate cavity.

DESCRIPTION OF THE VIEWS OF THE DRAWING

FIG. 1A through FIG. 1I are cross sections of an exemplary integrated circuit containing MOS transistors with replacement gates, depicted in successive stages of fabrication.

FIG. 2A through FIG. 2F depict an alternate fabrication sequence for the integrated circuit.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an MOS transistor is formed by forming a sacrificial gate dielectric layer and a sacrificial gate surrounded by dielectric material. A top surface of the sacrificial gate is exposed and the sacrificial gate and the sacrificial gate dielectric layer are removed to form a gate cavity. A conformal dielectric first liner is formed in the gate cavity and a conformal second liner is formed in the gate cavity on the first liner. An anisotropic first etch removes the second liner from the bottom of the gate cavity, leaving material of the second liner on sidewalls of the gate cavity. A second etch removes the first liner from an area of the bottom of the gate cavity exposed by the second liner, leaving material of the first liner on the bottom of the gate cavity under the second liner on the sidewalls of the gate cavity. A third etch removes the second liner from the gate cavity, leaving L-shaped spacers of the first liner in the gate cavity. A permanent gate dielectric layer is formed in the gate cavity and replacement gate is formed in the gate cavity. Forming the MOS transistor with the L-shaped spacers in the gate cavity may advantageously provide a wider gate cavity, that is a lower aspect ratio gate cavity, in which to form the replacement gate, thereby providing more process latitude for the gate replacement process.

Figure 1A:
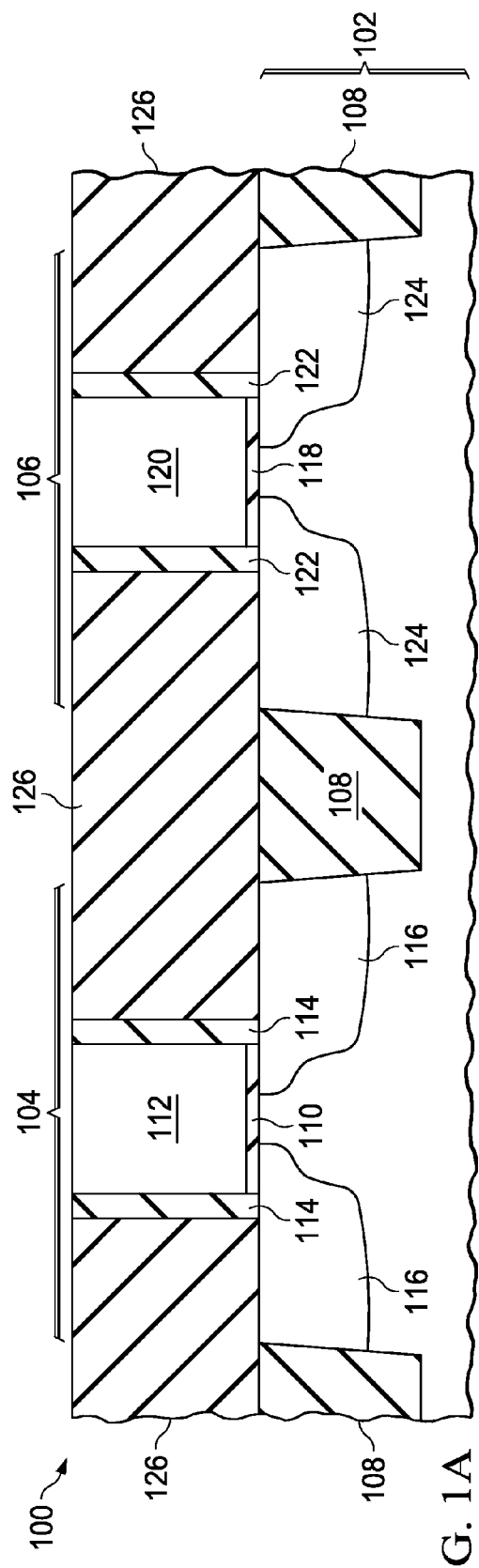

FIG. 1A through FIG. 1I are cross sections of an exemplary integrated circuit containing MOS transistors with replacement gates, depicted in successive stages of fabrication. Referring to FIG. 1A, the integrated circuit 100 is formed in and on a substrate 102 such as a single crystal silicon wafer, but may be a silicon-on-insulator (SOI) wafer, a hybrid orientation technology (HOT) wafer with regions of different crystal orientations, or other substrate appropriate for fabrication of the integrated circuit 100.

The integrated circuit 100 includes an area for a first MOS transistor 104, and possibly an area for a second MOS transistor 106 of an opposite polarity from the first MOS transistor 104. For example, the first MOS transistor 104 may be a p-channel MOS (PMOS) transistor 104 and the second MOS transistor 106 may be an n-channel MOS (NMOS) transistor 106. The first MOS transistor 104 and the second MOS transistor 106 may be laterally isolated by field oxide 108 formed at a top surface of the substrate 102. The field oxide 108 may include silicon dioxide formed by a shallow trench isolation (STI) process.

The first MOS transistor 104 includes a first sacrificial gate dielectric layer 110 formed at the top surface of the substrate 102. The first sacrificial gate dielectric layer 110 may be, for example, 2 to 5 nanometers of silicon dioxide formed by thermal oxidation of the top surface of the substrate 102. The first MOS transistor 104 includes a first sacrificial gate 112 formed on the first sacrificial gate dielectric layer 110. The first sacrificial gate 112 may be, for example, polycrystalline silicon, commonly referred to as polysilicon, 30 nanometers to 60 nanometers thick. The first sacrificial gate 112 may be formed, for example, by forming a layer of polysilicon on an existing top surface of the integrated circuit 100, forming an etch mask over the layer of polysilicon and removing polysilicon in a reactive ion etch (RIE) process to leave the first sacrificial gate 112. The first MOS transistor 104 may optionally include a first sidewall 114 of one or more layers of dielectric material, 2 to 30 nanometers thick, abutting lateral surfaces of the first sacrificial gate 112. The first sidewall 114 may be formed by thermal oxidation of the lateral surfaces of the first sacrificial gate 112 combined with forming one or more conformal layers of silicon nitride and/or silicon dioxide over the first sacrificial gate 112 followed by an anisotropic etch to remove the layers of silicon nitride and/or silicon dioxide from horizontal surfaces of the first sacrificial gate 112 and the substrate 102, leaving the first sidewall 114. The first MOS transistor 104 includes first source/drain regions 116 formed in the substrate 102 adjacent to, and underlapping, the first sacrificial gate 112. Lateral dimensions of the first source/drain regions 116 may be determined in part by the thickness of the first sidewall 114 during implantation of dopants into the substrate 102 to form the first source/drain regions 116.

The second MOS transistor 106 includes a second sacrificial gate dielectric layer 118 formed at the top surface of the substrate 102. The second sacrificial gate dielectric layer 118 may be, for example, similar to, and formed concurrently with, the first sacrificial gate dielectric layer 110. The second MOS transistor 106 includes a second sacrificial gate 120 formed on the second sacrificial gate dielectric layer 118. The second sacrificial gate 120 may be, for example, similar to, and formed concurrently with, the first sacrificial gate 112. The second MOS transistor 106 may optionally include a second sidewall 122 of one or more layers of dielectric material abutting lateral surfaces of the second sacrificial gate 120. The second sidewall 122 may be formed in a similar fashion as the first sidewall 114, but possibly with different layers and/or different thicknesses. The second MOS transistor 106 includes second source/drain regions 124 formed in the substrate 102 adjacent to, and underlapping, the second sacrificial gate 120. Lateral dimensions of the second source/drain regions 124 may be determined in part by the thickness of the second sidewall 122 during implantation of dopants into the substrate 102 to form the second source/drain regions 124.

A protective dielectric layer 126 is formed over the substrate 102. The protective dielectric layer 126 may include, for example, one or more layers of silicon dioxide and/or silicon nitride. The protective dielectric layer 126 may further include a cap layer, not shown, of hard material such as silicon nitride or silicon carbide nitride to provide a stop layer for a subsequent removal process.

The protective dielectric layer 126 is removed from top surfaces of the first sacrificial gate 112 and the second sacrificial gate 120, for example by a chemical mechanical polish (CMP) process, so as to expose the top surfaces of the first sacrificial gate 112 and the second sacrificial gate 120.

Figure 1B:
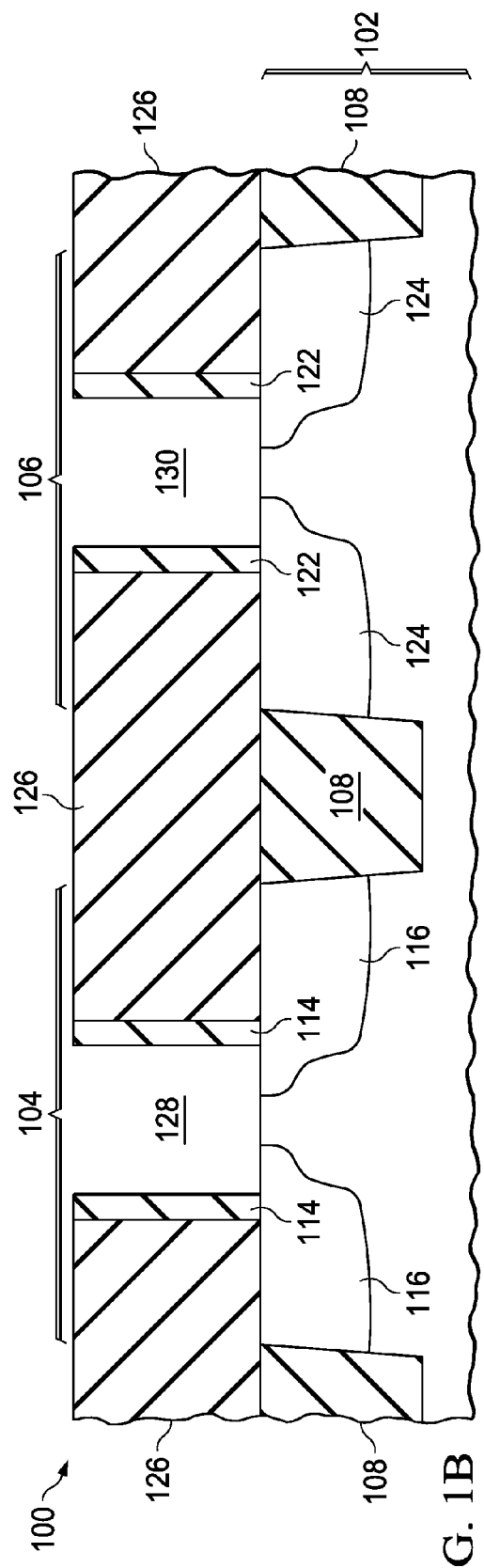

Referring to FIG. 1B, the first sacrificial gate 112 and the first sacrificial gate dielectric layer 110 are removed to form a first gate cavity 128. Concurrently, the second sacrificial gate 120 and the second sacrificial gate dielectric layer 118 are removed to form a second gate cavity 130. The first sacrificial gate 112 and the second sacrificial gate 120 may be removed, for example, using a wet etch with an aqueous solution of tetra-methyl ammonium hydroxide (TMAH). After the first sacrificial gate 112 and the second sacrificial gate 120 are removed, the first sacrificial gate dielectric layer 110 and the second sacrificial gate dielectric layer 118 may be concurrently removed with a wet etch of aqueous buffered hydrofluoric acid. At least a portion of the first sidewall 114 and the second sidewall 122 remain in place after removal of the first sacrificial gate 112, the second sacrificial gate 120, the first sacrificial gate dielectric layer 110 and the second sacrificial gate dielectric layer 118 is completed.

Referring to FIG. 1C, a first liner 132 of dielectric material is conformally formed on a top surface of the protective dielectric layer 126, extending into the first gate cavity 128 and the second gate cavity 130. The first liner 132 contacts the substrate 102 at bottoms of the first gate cavity 128 and the second gate cavity 130. The first liner 132 is continuous on the first sidewall 114 and the second sidewall 122 and provides an etch stop layer to protect the first sidewall 114 and the second sidewall 122 in a subsequent wet etch process. The first liner 132 may be, for example, silicon dioxide formed by a multiple step sequential deposition process similar to atomic layer deposition (ALD), to provide a desired thickness control and conformality. A minimum thickness of the first liner 132 may be 1 nanometer. A maximum thickness of the first liner 132 is dependent on desired gate lengths of the first MOS transistor 104 and the second MOS transistor 106 and a minimum spacer between transistors in the integrated circuit 100. In one example, instances of the first MOS transistor 104 and the second MOS transistor 106 with desired gate lengths of 26 nanometers to 30 nanometers may have an instance of the first liner 132 with a thickness of 1 nanometer to 4 nanometers. In another example, instances of the first MOS transistor 104 and the second MOS transistor 106 with desired gate lengths of 18 nanometers to 22 nanometers may have an instance of the first liner 132 with a thickness of 1 nanometer to 3 nanometers. In a further example, instances of the first MOS transistor 104 and the second MOS transistor 106 with desired gate lengths of 12 nanometers to 16 nanometers may have an instance of the first liner 132 with a thickness of 1 nanometer to 2.5 nanometers.

A second liner 134 of a different dielectric material from the first liner 132 is conformally formed on the first liner 132, extending into the first gate cavity 128 and the second gate cavity 130. The second liner 134 may be, for example, silicon nitride formed by a plasma enhanced chemical vapor deposition (PECVD) process using hexachlorodisilane and ammonia. Process parameters for formation of the second liner 134, such as pressure, temperature and formation time, are selected to provide a desired thickness of the second liner 134 on vertical surfaces of the first liner 132 in the first gate cavity 128 and the second gate cavity 130. A minimum thickness of the second liner 134 may be 1 nanometer. A total maximum thickness of the first liner 132 and the second liner 134 is also dependent on desired gate lengths of the first MOS transistor 104 and the second MOS transistor 106 and a minimum spacer between transistors in the integrated circuit 100. In the first case described above, instances of the first MOS transistor 104 and the second MOS transistor 106 with desired gate lengths of 26 nanometers to 30 nanometers may have a total maximum thickness of the first liner 132 and the second liner 134 of 5 nanometers. In the second case described above, instances of the first MOS transistor 104 and the second MOS transistor 106 with desired gate lengths of 18 nanometers to 22 nanometers may have a total maximum thickness of the first liner 132 and the second liner 134 of 4 nanometers. In the third case described above, instances of the first MOS transistor 104 and the second MOS transistor 106 with desired gate lengths of 12 nanometers to 16 nanometers may have a total maximum thickness of the first liner 132 and the second liner 134 of 3.5 nanometers.

Figure 1D:
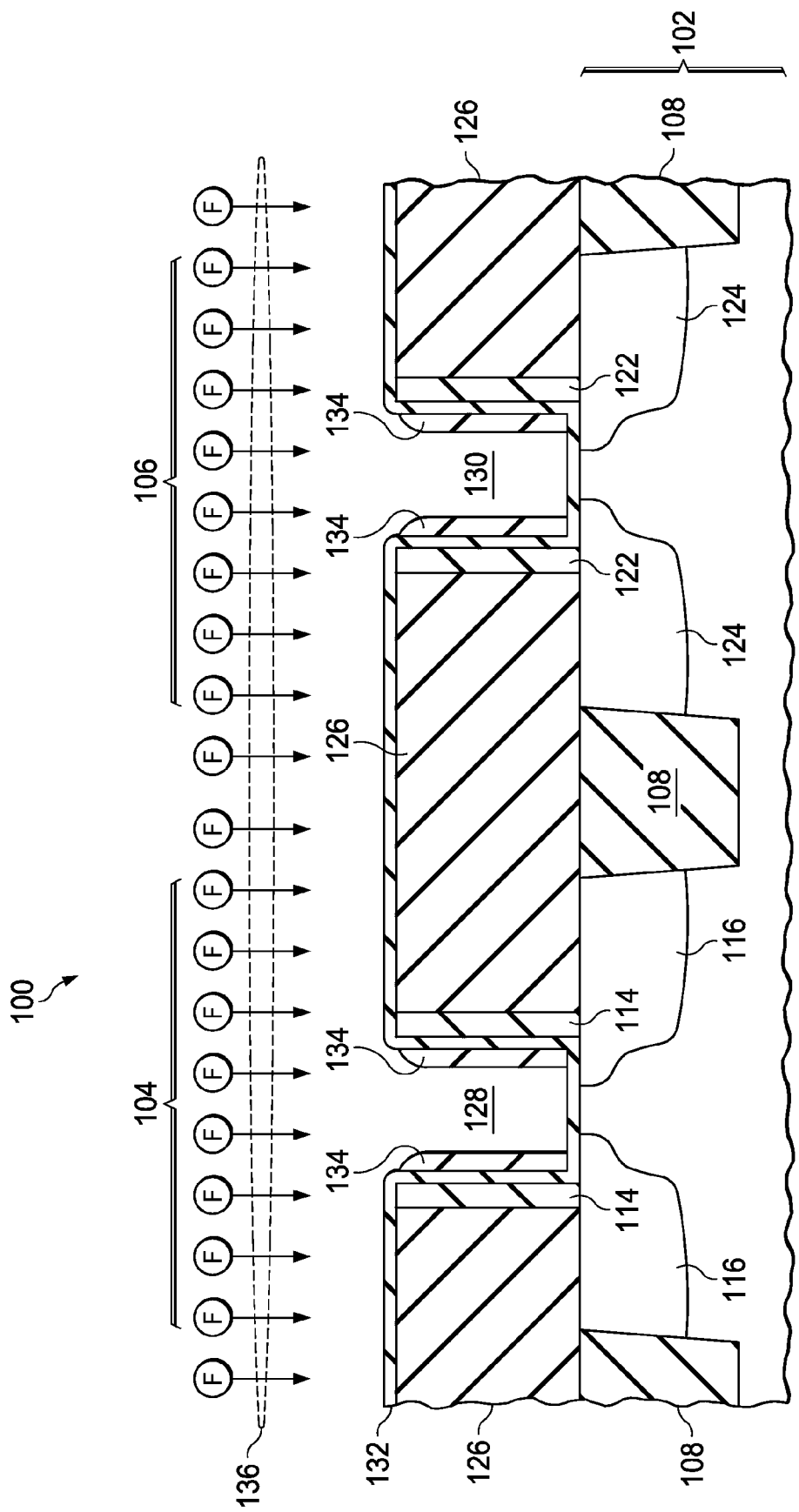

Referring to FIG. 1D, an anisotropic first etch process 136 such as an RIE process using fluorine radicals, as schematically depicted in FIG. 1D, removes the second liner 134 from over the top surface of the protective dielectric layer 126 and from the bottoms of the first gate cavity 128 and the second gate cavity 130, leaving the second liner 134 on vertical surfaces of the first liner 132 in the first gate cavity 128 and the second gate cavity 130. Process parameters of the anisotropic first etch process 136, such as pressure, power and overetch time, are selected so as to leave a desired thickness of the first liner 132 on the substrate 102 at the bottoms of the first gate cavity 128 and the second gate cavity 130.

Figure 1E:
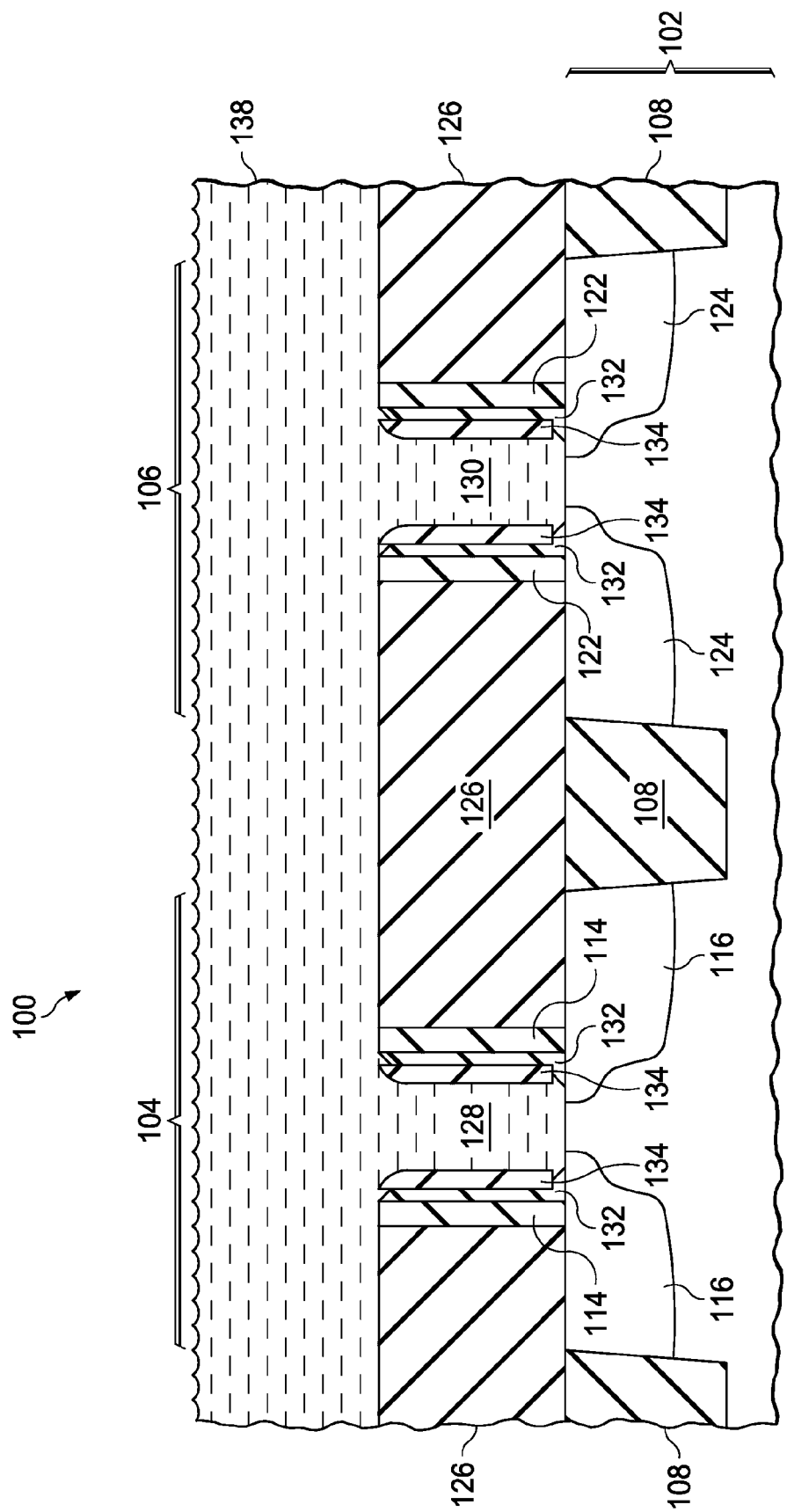

Referring to FIG. 1E, a second etch process 138 removes the first liner 132 from the top surface of the protective dielectric layer 126 and from the bottoms of the first gate cavity 128 and the second gate cavity 130 to expose the substrate 102. The second etch process 138 leaves the first liner 132 on vertical surfaces of the first sidewall 114 and on the substrate 102 under the second liner 134 in the first gate cavity 128. Similarly, the second etch process 138 leaves the first liner 132 on vertical surfaces of the second sidewall 122 and on the substrate 102 under the second liner 134 in the second gate cavity 130. The second etch process 138 may be, for example, a wet etch process 138 as depicted in FIG. 1E, using a dilute aqueous solution of buffered hydrofluoric acid. Process parameters of the second wet etch process 138, such as temperature, strength of the buffered hydrofluoric acid solution, and etch time, are selected to provide a desired amount of the first liner 132 remaining on the substrate 102 under the second liner 134.

Figure 1F:
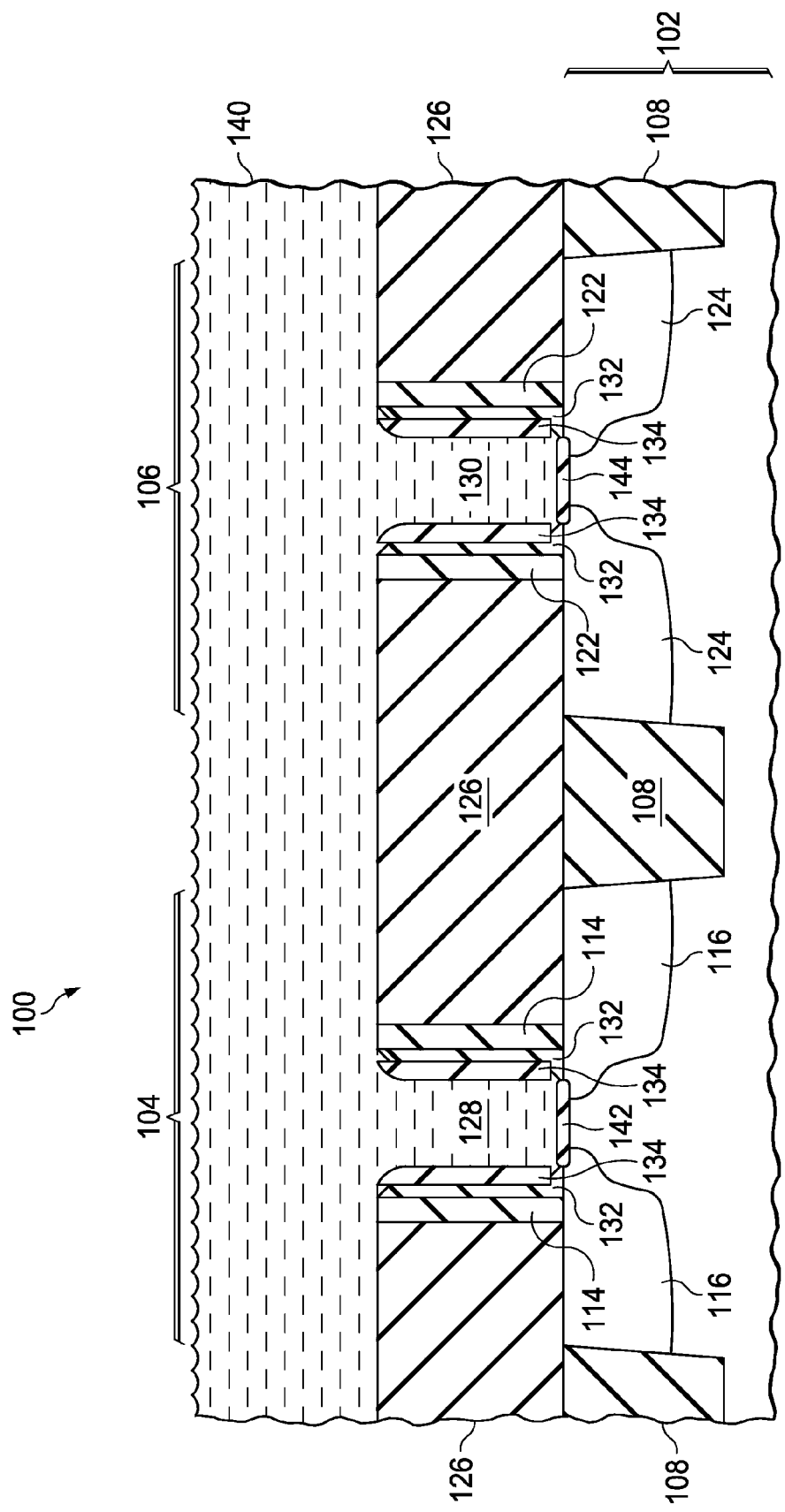

Referring to FIG. 1F, a chemical oxidation process 140 forms a first silicon oxide layer 142 at the top surface of the substrate 102 in the first gate cavity 128 and a second silicon oxide layer 144 at the top surface of the substrate 102 in the second gate cavity 130. The chemical oxidation process 140 may use, for example, an aqueous mixture of sulfuric acid and hydrogen peroxide at 150° C., or may alternatively use an aqueous mixture of ammonium hydroxide and hydrogen peroxide at 85° C.

Figure 1G:
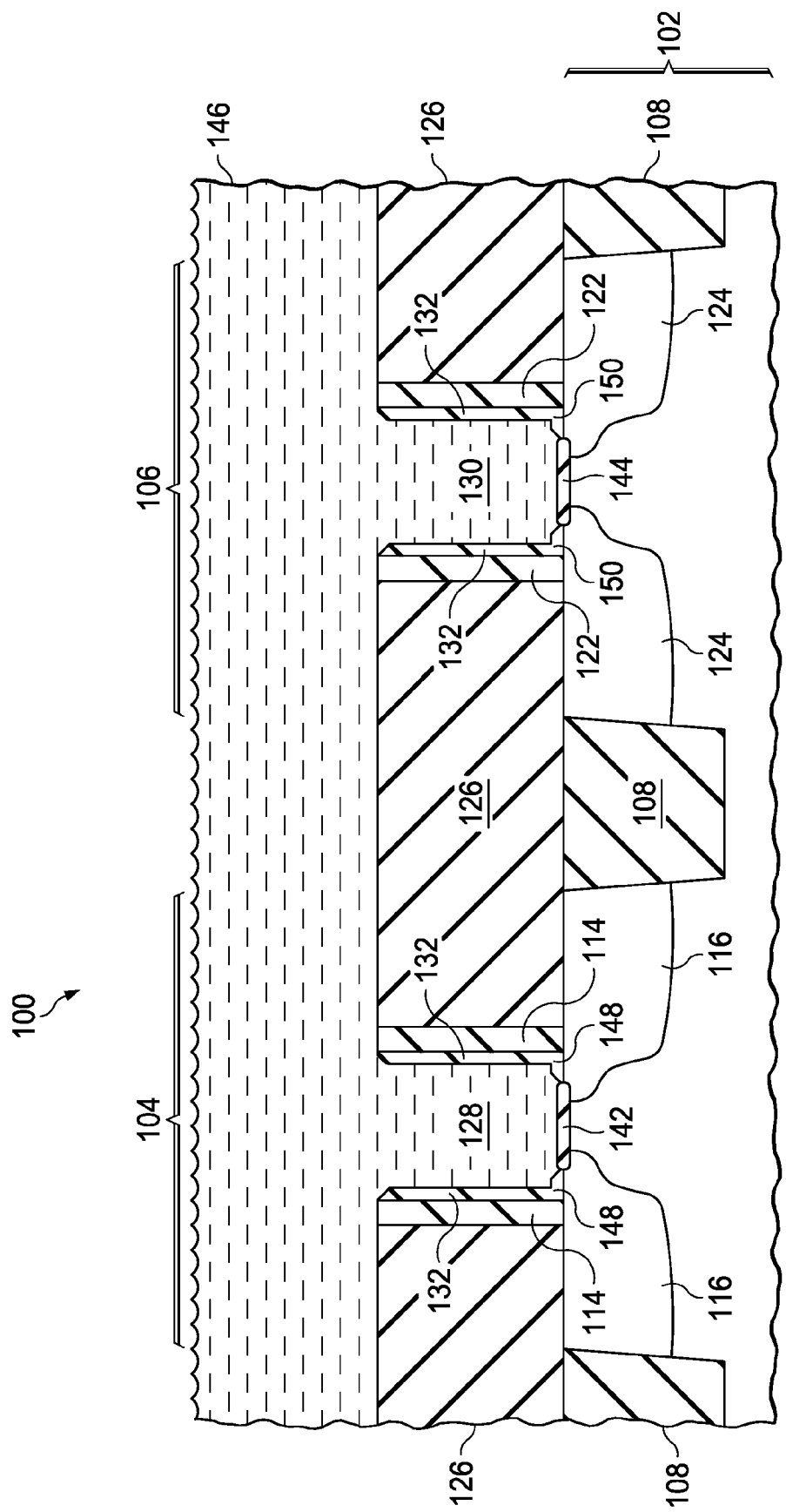

Referring to FIG. 1G, a third etch process 146 removes the second liner 134 of FIG. 1F in the first gate cavity 128 and the second gate cavity 130. The third etch process 146 leaves substantially all the first liner 132 in place in the first gate cavity 128 as a first L-shaped spacer 148 on the substrate 102, and leaves substantially all the first liner 132 in place in the second gate cavity 130 as a second L-shaped spacer 150 on the substrate 102. The third etch process 146 may be, for example, a wet etch process 146 as depicted in FIG. 1G, using an aqueous solution of phosphoric acid at 150° C. to 160° C. Process parameters of the third etch process 146, such as temperature, strength of the phosphoric acid solution, and etch time, are selected to provide a desired thickness of the first L-shaped spacer 148 and the second L-shaped spacer 150 on the substrate 102. The first silicon oxide layer 142 and the second silicon oxide layer 144 protect the substrate 102 during the third etch process 146.

Referring to FIG. 1H, the first silicon oxide layer 142 and the second silicon oxide layer 144 are subsequently removed, for example using a very dilute aqueous solution of buffered hydrofluoric acid. A lateral portion of the first L-shaped spacer 148 extends inwardly along the surface 102 of the substrate from a vertical portion of the first L-shaped spacer 148 by a distance 152 of at least 1 nanometer. Similarly, a lateral portion of the second L-shaped spacer 150 extends inwardly along the surface of the substrate 102 from a vertical portion of the second L-shaped spacer 150 by a distance 154 of at least 1 nanometer.

Figure 1I:
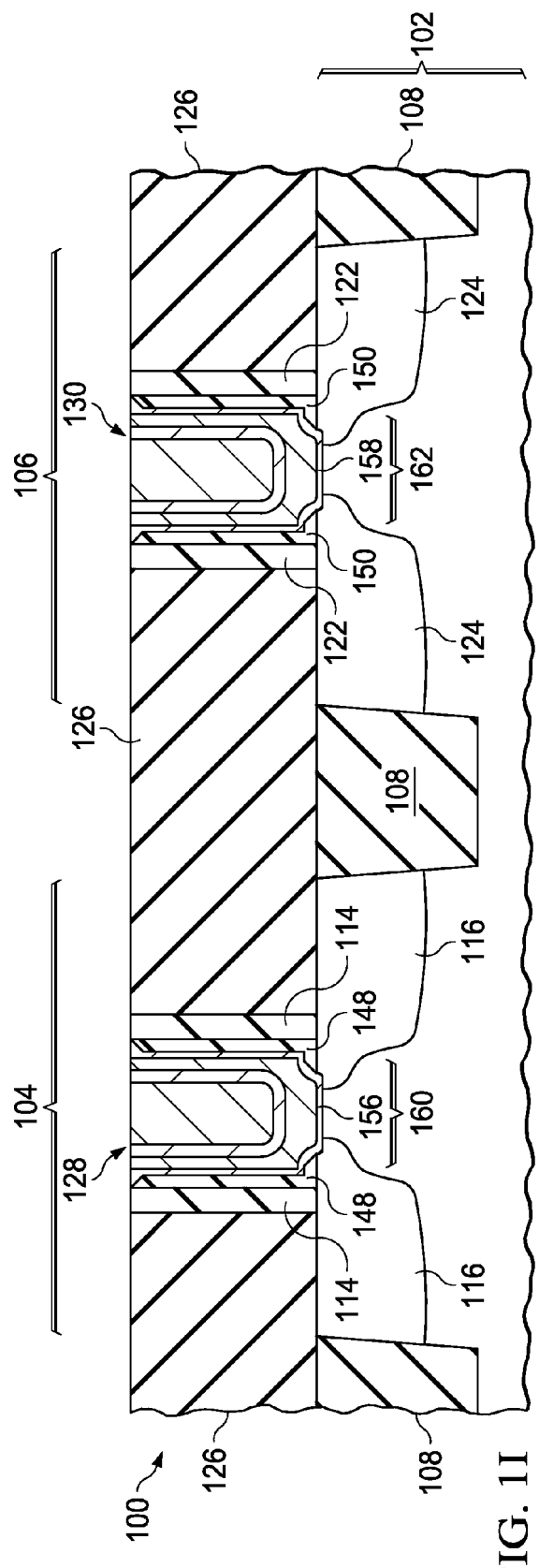

Referring to FIG. 1I, a first permanent gate dielectric layer 156 is formed on the substrate 102 and on the first L-shaped spacer 148 in the first gate cavity 128. The first permanent gate dielectric layer 156 may include, for example, one or more dielectric materials with high dielectric constants, such as hafnium oxide and/or zirconium oxide. A second permanent gate dielectric layer 158 is formed on the substrate 102 and on the second L-shaped spacer 150 in the second gate cavity 130. The second permanent gate dielectric layer 158 may also include dielectric materials with high dielectric constants, and may be formed concurrently with the first permanent gate dielectric layer 156.

A first replacement gate 160 is formed on the first permanent gate dielectric layer 156 in the first gate cavity 128. The first replacement gate 160 may include one or more layers of gate materials such as titanium nitride, polysilicon, titanium and aluminum to provide a desired work function appropriate to the first MOS transistor 104.

A second replacement gate 162 is formed on the second permanent gate dielectric layer 158 in the second gate cavity 130. The second replacement gate 162 may include one or more layers of gate materials such as titanium nitride, polysilicon, titanium and aluminum to provide a desired work function appropriate to the second MOS transistor 106. The layers of the second replacement gate 162 may be different from the layers of the first replacement gate 160, reflecting a difference between the desired work function for the first MOS transistor 104 and the desired work function for the second MOS transistor 106.

The first permanent gate dielectric layer 156 and the first replacement gate 160 overlap a lateral portion of the first L-shaped spacer 148 contacting the substrate 102. The first L-shaped spacer 148 extends vertically and abuts the first permanent gate dielectric layer 156 along a vertical surface. Similarly, the second permanent gate dielectric layer 158 and the second replacement gate 162 overlap a lateral portion of the second L-shaped spacer 150 contacting the substrate 102. The second L-shaped spacer 150 extends vertically and abuts the second permanent gate dielectric layer 158 along a vertical surface.

Figure 2A:
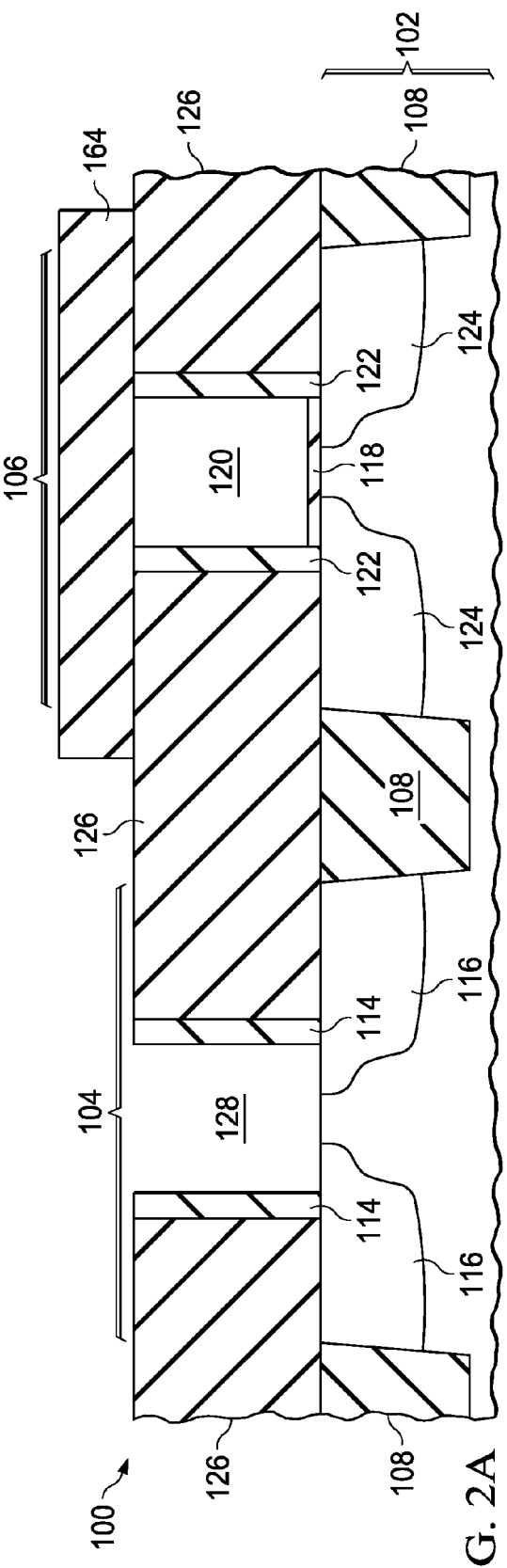

FIG. 2A through FIG. 2F depict an alternate fabrication sequence for the integrated circuit 100. In the instant example, the first replacement gate 160 of the first MOS transistor 104 is formed while the second sacrificial gate 120 of the second MOS transistor 106 is blocked. Subsequently, the second replacement gate 162 of the second MOS transistor is formed while the first replacement gate 160 of the first MOS transistor 104 is blocked. Referring to FIG. 2A, a first gate block 164 is formed over the second sacrificial gate 120. The first gate block 164 may be, for example, one or more layers of silicon dioxide and/or silicon nitride. Subsequently, the first sacrificial gate 112 and the first sacrificial gate dielectric layer 110 of FIG. 1A are removed to form the first gate cavity 128.

Figure 2B:
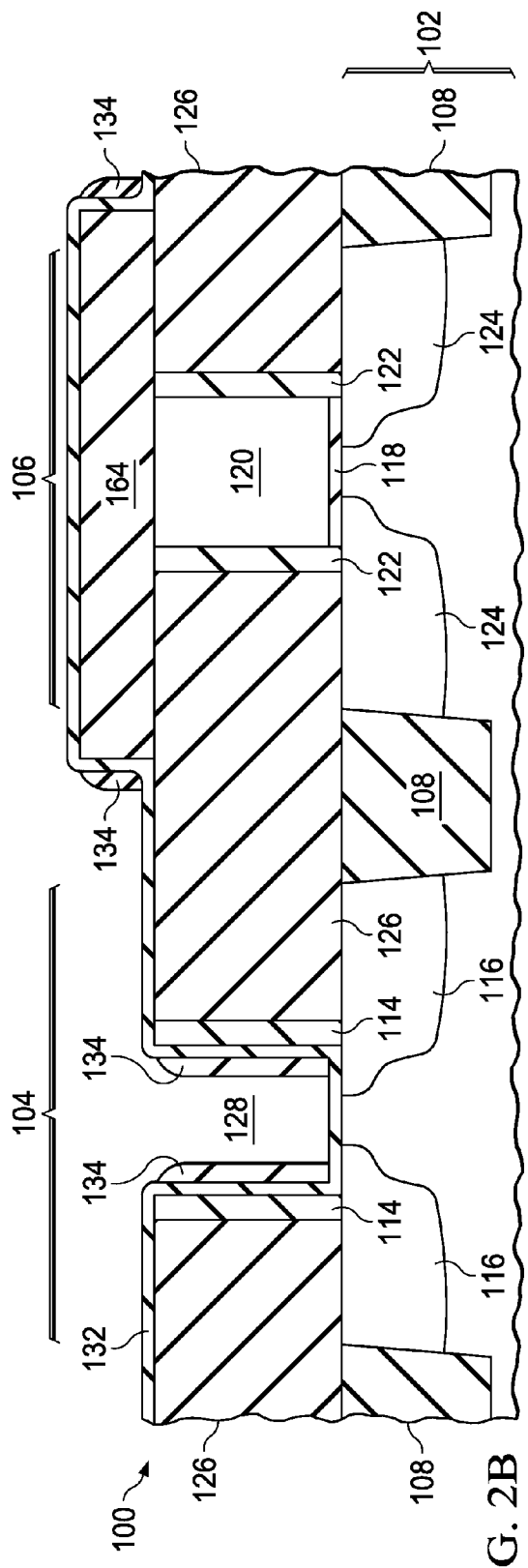

Referring to FIG. 2B, the first liner 132, in the instant example for the first MOS transistor 104, is conformally formed on a top surface of the protective dielectric layer 126, extending into the first gate cavity 128 and over the first gate block 164. The second liner 134, also for the first MOS transistor 104 in the instant example, is conformally formed on the first liner 132, extending into the first gate cavity 128 and over the first gate block 164. The anisotropic first etch process 136 of FIG. 1D removes the second liner 134 from over the top surface of the protective dielectric layer 126 and the first gate block 164 and from the bottom of the first gate cavity 128, leaving the second liner 134 on vertical surfaces of the first liner 132 in the first gate cavity 128 and possibly on the first gate block 164.

Figure 2C:
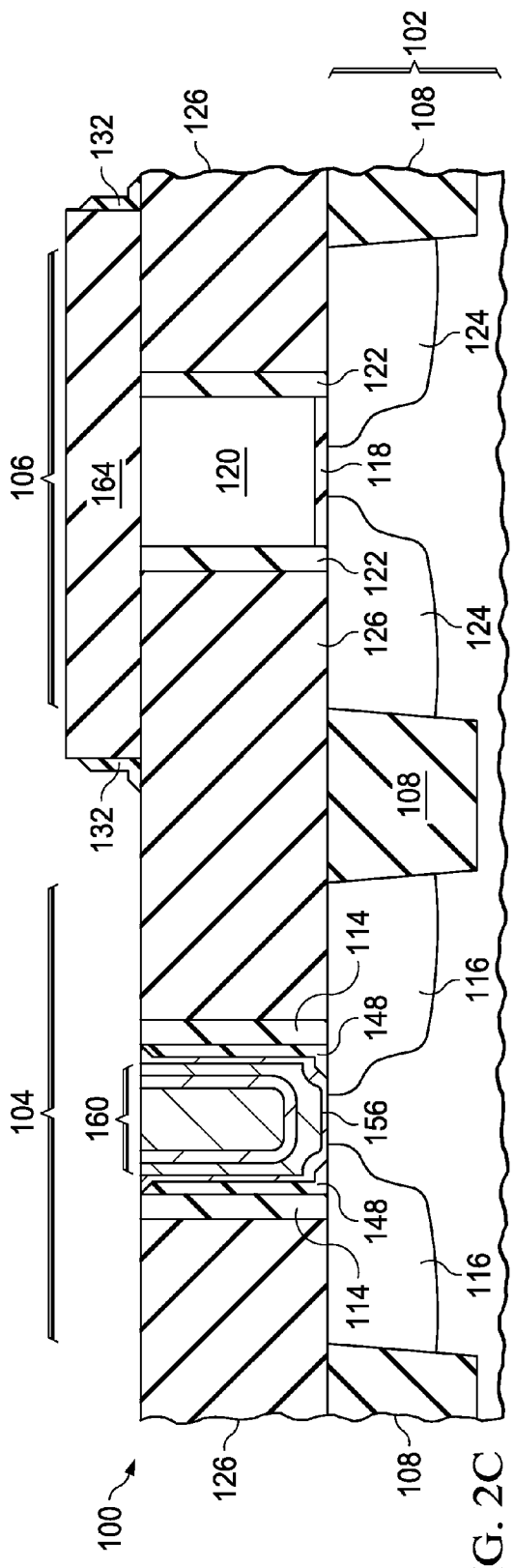

Referring to FIG. 2C, the first replacement gate 160 of the first MOS transistor 104 is formed as described in reference to FIG. 1E through FIG. 1I. Residual material of the first liner 132 may remain on the first gate block 164 as depicted in FIG. 2C. The first gate block 164 is subsequently removed after formation of the first replacement gate 160 is completed.

Referring to FIG. 2D, a second gate block 166 is formed over the first replacement gate 160 of the first MOS transistor 104. The second gate block 166 may be formed similarly to the first gate block 164 of FIG. 2A. Subsequently, the second sacrificial gate 120 and the second sacrificial gate dielectric layer 118 of FIG. 2C are removed to form the second gate cavity 130.

Referring to FIG. 2E, a third liner 168 for the second MOS transistor 106 is conformally formed on a top surface of the protective dielectric layer 126, extending into the second gate cavity 130 and over the second gate block 166. A fourth liner 170, also for the second MOS transistor 106 in the instant example, is conformally formed on the third liner 168, extending into the second gate cavity 130 and over the first gate block 164. The third liner 168 for the second MOS transistor 106 may have a same thickness as the first liner 132 for the first MOS transistor 104, or may have a different thickness. Similarly, the fourth liner 170 for the second MOS transistor 106 may have a same thickness as the second liner 134 for the first MOS transistor 104, or may have a different thickness.

An anisotropic first etch process, similar to the anisotropic first etch process 136 of FIG. 1D, removes the fourth liner 170 from over the top surface of the protective dielectric layer 126 and the second gate block 166 and from the bottom of the second gate cavity 130, leaving the fourth liner 170 on vertical surfaces of the third liner 168 in the second gate cavity 130 and possibly on the second gate block 166.

Figure 2F:
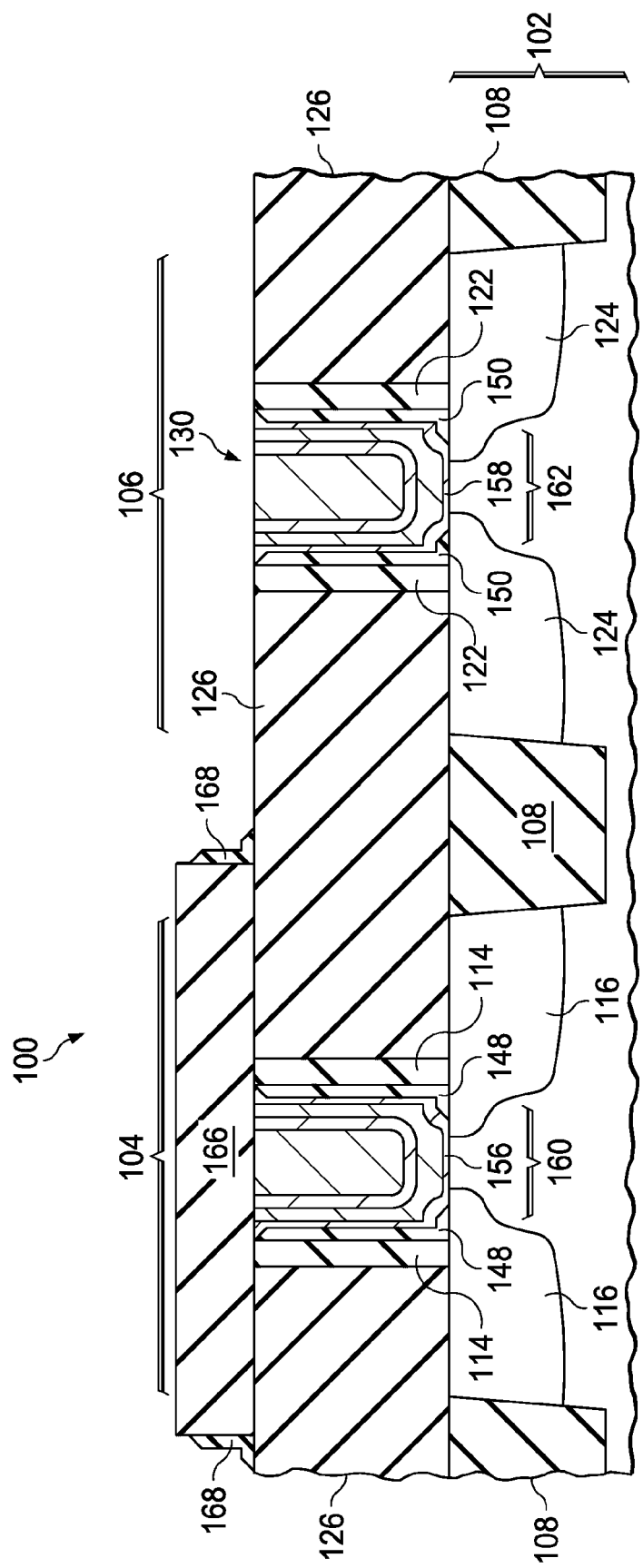

Referring to FIG. 2F, the second replacement gate 162 of the second MOS transistor 106 is formed as described in reference to FIG. 1E through FIG. 1I. Residual material of the third liner 168 may remain on the second gate block 166 as depicted in FIG. 2F. The second gate block 166 is subsequently removed after formation of the second replacement gate 162 is completed.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a first metal oxide semiconductor (MOS) transistor of a first polarity, said first MOS transistor comprising:
   a permanent gate dielectric layer contacting a substrate of said integrated circuit;
   a replacement gate disposed on said permanent gate dielectric layer; and
   an L-shaped spacer of dielectric material disposed on said substrate and abutting said permanent gate dielectric layer, so that said permanent gate dielectric layer and said replacement gate overlap a lateral portion of said L-shaped spacer contacting said substrate, said L-shaped spacer extending vertically and abutting said permanent gate dielectric layer along a vertical surface; and
   a second MOS transistor of a second, opposite, polarity.

2. The integrated circuit of claim 1, in which said L-shaped spacer comprises silicon dioxide.

3. The integrated circuit of claim 1, in which:
   a gate length of said MOS transistor is 26 nanometers to 30 nanometers; and
   a thickness of said L-shaped spacer is 1 nanometer to 4 nanometers.

4. The integrated circuit of claim 1, in which:
   a gate length of said MOS transistor is 18 nanometers to 22 nanometers; and
   a thickness of said L-shaped spacer is 1 nanometer to 3 nanometers.

5. The integrated circuit of claim 1, in which:
   a gate length of said MOS transistor is 12 nanometers to 16 nanometers; and
   a thickness of said L-shaped spacer is 1 nanometer to 2.5 nanometers.

6. The integrated circuit of claim 1, in which:
   said permanent gate dielectric is a first permanent gate dielectric;
   said replacement gate is a first replacement gate;
   said L-shaped spacer is a first L-shaped spacer; and
   said second MOS transistor comprises:
      a second permanent gate dielectric layer contacting a substrate of said integrated circuit;
      a second replacement gate disposed on said second permanent gate dielectric layer; and
      an second L-shaped spacer of dielectric material disposed on said substrate and abutting said second permanent gate dielectric layer, so that said second permanent gate dielectric layer and said second replacement gate overlap a lateral portion of said second L-shaped spacer contacting said substrate, said second L-shaped spacer extending vertically and abutting said second permanent gate dielectric layer along a vertical surface.

* * * * *